United States Patent [19]

Yeung

[11] Patent Number: 5,506,536
[45] Date of Patent: Apr. 9, 1996

[54] DIFFERENTIAL AMPLIFIER WITH EXPONENTIAL GAIN CHARACTERISTIC

[75] Inventor: Pak-Ho Yeung, San Jose, Calif.

[73] Assignee: National Semiconductor Corporation, Del.

[21] Appl. No.: 357,605

[22] Filed: Dec. 14, 1994

[51] Int. Cl.$^6$ ............................... H03F 3/45; G06G 7/24
[52] U.S. Cl. .......................... 327/346; 330/252; 330/260
[58] Field of Search ................................... 330/252, 260, 330/261, 149; 327/346, 347, 348, 349

[56] References Cited

U.S. PATENT DOCUMENTS

| | | | |
|---|---|---|---|
| 4,468,629 | 8/1984 | Choma, Jr. ............................. | 330/260 |
| 4,769,617 | 9/1988 | Mizuide ................................. | 330/260 |
| 4,774,475 | 9/1988 | LaVoie .................................. | 330/149 |
| 4,774,476 | 9/1988 | Ecklund et al. ....................... | 330/260 |
| 4,794,348 | 12/1988 | McGinn ................................ | 330/252 |
| 4,820,997 | 4/1989 | Sano et al. ............................ | 330/252 |
| 4,835,488 | 5/1989 | Garuts .................................. | 330/258 |
| 5,184,086 | 2/1993 | Inohana et al. ....................... | 330/252 |

OTHER PUBLICATIONS

S. D. Willingham et al., "A BiCMOS Low–Distortion 8–MHz Low-Pass Filter," IEEE Journal of Solid State Circuits, vol. 28, No. 12, Dec. 1993, pp. 1234–1245.

M. Koyama et al., "A 2.5–V Active Low–Pass Filter Using All-n-p-n Gilbert Cells with a 1-$V_{p-p}$ Linear Input Range," IEEE Journal of Solid State Circuits, vol. 28, No. 12, Dec. 1993, pp. 1246–1253.

Shaun Simpkins et al., "Cascomp Feedforward Error Correction in High Speed Amplifier Design," IEEE Journal of Solid State Circuits, vol. SC–18, No. 6, Dec. 1983, pp. 762–764.

Kiyoshi Fukahori, "A Bipolar Voltage-Controlled Tunable Filter," IEEE Journal of Solid State Circuits, vol. SC–16, No. 6, Dec. 1981, pp. 729–737.

O. Schade, Jr., "Advances in BIMOS Integrated Circuits," RCA Review, vol. 30, Jun. 1978.

*Primary Examiner*—James B. Mullins
*Attorney, Agent, or Firm*—Limbach & Limbach

[57] ABSTRACT

A differential amplifier provides a predetermined gain characteristic over a large range differential input voltage signals and operating temperatures. The differential amplifier receives a first differential input voltage signal at a pair of amplifier input terminals and outputs a differential output current signal at a pair of amplifier output terminals. First and second emitter-coupled transistors are connected to receive at their bases an amplifier core differential voltage signal, have their emitters coupled to receive first and second constant currents and coupled together by a load element. The first and second emitter follower transistors have their bases coupled to the amplifier input terminals to receive the first differential input voltage signal from the pair of amplifier input terminals. The emitters of the first and second emitter follower transistors are coupled to provide the amplifier core differential voltage signal to the bases of the first and second emitter-coupled transistors, respectively. A VBE difference replicator receives the current in the collectors of the first and second emitter-coupled transistors and provides, responsive to the emitter-coupled transistors' collector currents, a replicated voltage that substantially replicates a voltage difference between the VBE of the first emitter-coupled transistor and the VBE of the second emitter-coupled transistor. An adaptive current source receives current from the emitters of the first and second emitter followers. The adaptive current source also receives the replicated voltage from the VBE difference replicator. The adaptive current source means draws a differential correcting current signal through the first and second emitter followers responsive to the replicated voltage. As a result, a difference between the VBE of the first emitter follower and the VBE of the second emitter follower compensates the amplifier core differential voltage to correct for a difference between the VBE of the first emitter-coupled transistor and the VBE of the second emitter-coupled transistor.

2 Claims, 2 Drawing Sheets

DIFFERENTIAL AMPLIFIER WITH EXPONENTIAL GAIN CHARACTERISTIC

FIELD OF INVENTION

The present invention relates to differential amplifiers and, in particular, to a differential amplifier which not only exhibits a predetermined gain characteristic over a large range of input signals, but also functions reliably over a relatively large negative power supply range.

BACKGROUND OF THE INVENTION

FIG. 1 shows a conventional differential amplifier 8. First and second emitter-coupled transistors Q3, Q4 are connected to receive at their bases a differential voltage signal Vin applied at input terminals 10, 12. A load element ZE (for example, a degenerate resister) couples the emitters of the first and second emitter-coupled transistors Q3, Q4. First and second constant current sources 14, 16 each provide a current $I_0$ to the emitters of the first and second emitter-coupled transistors Q3, Q4, respectively. A differential output current signal Iout, nominally proportional to Vin is provided at output terminals 17, 18.

The gain of the differential amplifier 8 is proportional to Iin. Iin equals $$\frac{Vin - VBEQ3 + VBEQ4}{ZE}$$

where VBEQ3 and VBEQ4 are the base-emitter voltages of first and second emitter-coupled transistors Q3 and Q4, respectively; and ZE is the value of the degenerate resister.

It is well known that the VBE of a transistor is a logarithmic function of the transistor's collector current. Thus, since in normal operation of the differential amplifier 8, the collector currents of first and second emitter-coupled transistors Q3 and Q4 vary with Vin, the quantity (VBEQ3−VBEQ4) likewise varies with Vin. In particular, when Vin varies over a large range, the difference of VBEQ3 from VBEQ4 varies significantly, especially if Iin approaches the value of $I_0$. The quantity (VBEQ3− VBEQ4) also varies with variance in the absolute temperature of the environment in which the differential amplifier 8 is operating.

One prior art differential amplifier circuit 20, shown in FIG. 2, addresses this problem. The differential amplifier circuit 20 is disclosed in U.S. Pat. No. 4,769,617 (issued Sep. 6, 1988, to Mizuide). Where the components in FIG. 2 are the same as those in FIG. 1, the same reference numerals are used. Differential amplifier circuit 20 includes a first transistor Q1 interposed between the first current output terminal 17 and the first emitter-coupled transistor Q3. In particular, the collector of the transistor Q1 is connected to the first current output terminal 17 and the emitter of the transistor Q1 is connected to the collector of the first emitter-coupled transistor Q3. Likewise, a second transistor Q2 is interposed between the second output terminal 18 and the second emitter-coupled transistor Q4, the collector of the second transistor Q2 being connected to the second current output terminal 18 and the emitter of the second transistor Q2 being connected to the collector of the second emitter-coupled transistor Q4.

In addition, the amplifier input terminals 10 and 12 are coupled to the bases of the first and second transistors emitter-coupled transistors Q3 and Q4, respectively, by first and second emitter follower transistors Q5 and Q6, respectively. First and second emitter follower transistors Q5 and Q6 are biased with identical currents IE1 and IE2, respectively, from constant current sources 22 and 24, respectively.

Differential amplifier 20 provides a differential current signal at first and second current output terminals 17, 18, equal to $$\frac{Vin - (VBEQ5 + VBEQ1 + VBEQ4) + (VBEQ6 + VBEQ2 + VBEQ3)}{RE1 + RE2}$$

where VBEQ1 through VBEQ6 are the base-emitter voltages of transistors Q1 through Q6, respectively. Since the emitter follower transistors Q5 and Q6 are biased with identical currents IE1 and IE2, respectively, from constant current sources 22, 24, VBEQ5 is equal to VBEQ6.

Furthermore, the emitter of first transistor Q1 is coupled to the base of second emitter-coupled transistor Q4, and the emitter of second transistor Q2 is coupled to the base of first emitter-coupled transistor Q3. Because of the connection of the emitter of first transistor Q1 to the collector of first emitter-coupled transistor Q3, the collector current into first transistor Q1 is ensured to be equal to the collector current into first emitter-coupled transistor Q3. Thus, VBEQ1 is ensured to be equal to VEBQ3. Similarly, because of the connection of the emitter of second transistor Q2 to the collector of second emitter-coupled transistor Q4, the collector current into second transistor Q2 is ensured to be equal to the collector current into second emitter-coupled transistor Q4. Thus, VBEQ2 is ensured to be equal to VBEQ4.

As a result, the output differential current at first and second current output terminals 17, 18, is equal to $$2 \times \left( \frac{V_{in}}{RE1 + RE2} \right)$$

regardless of the value of Vin and, furthermore, regardless of the absolute temperature of the environment in which the differential amplifier circuit 20 is operating.

However, a problem with the differential amplifier circuit 20 is that Vin must be kept less than about 0.5 volts in order to keep first and second emitter-coupled transistors Q3, Q4 out of saturation operation. That is, the base-collector voltage of first and second emitter-coupled transistors Q3, Q4 is equal to Vin+(VBEQ1−VBEQ2). VBEQ2 and VBEQ1 are typically within 100 millivolts of each other. If Vin is greater than about 0.5 volts, the base collector voltages of first and second emitter-coupled transistors Q3 and Q4 can exceed the forward bias of the PN junction and thus saturate first and second emitter-coupled transistors Q3 and Q4.

SUMMARY OF THE INVENTION

The present invention is a differential amplifier which provides a predetermined gain characteristic over a large range of differential input voltage signals and operating temperatures. In particular, the present invention is a differential amplifier coupled to receive a first differential input voltage signal at a pair of amplifier input terminals and to output a differential output current signal, which is a predetermined function of the differential voltage signal, at a pair of amplifier output terminals.

The differential amplifier includes a differential amplifier core including first and second emitter-coupled transistors connected to receive at their bases an amplifier core differential voltage signal. A load element couples the emitters of the first and second emitter-coupled transistors. The emitters of the first and second emitter-coupled transistors are coupled to receive first and second constant currents, respectively.

The first and second emitter follower transistors have their bases coupled to the amplifier input terminals to receive the first differential input voltage signal from the pair of amplifier input terminals. The emitters of the first and second emitter follower transistors are coupled to provide the amplifier core differential voltage signal to the bases of the first and second emitter-coupled transistors, respectively.

A VBE difference replicator is coupled to receive the current in the collectors of the first and second emitter-coupled transistors and to provide, responsive to the emitter-coupled transistors' collector currents, a replicated voltage that substantially replicates the voltage difference between the VBE of the first emitter-coupled transistor and the VBE of the second emitter-coupled transistor. An adaptive current source is coupled to receive current from the emitters of the first and second emitter followers. The adaptive current source is also coupled to receive the replicated voltage from the VBE difference replicator. The adaptive current source draws a differential correcting current signal through the first and second emitter followers responsive to the replicated voltage.

As a result, the difference between the VBE of the first emitter follower and the VBE of the second emitter follower compensates the amplifier core differential voltage to correct for a difference between the VBE of the first emitter-coupled transistor and the VBE of the second emitter-coupled transistor. With this compensation, the voltage difference across the load element is substantially equal to the first differential voltage regardless of the magnitude of the first differential input voltage signal and, further, regardless of the temperature of the environment in which the differential amplifier is operating.

In a particular embodiment, the adaptive current source comprises a first adaptive current source transistor having its collector coupled to receive the emitter current from the first emitter follower transistor and a second adaptive current source transistor having its collector coupled to receive the emitter current from the second emitter follower transistor. The first and second adaptive current source transistors have their emitters coupled to receive a constant current from a third constant current source.

The VBE difference replicator may comprise a first replicator transistor coupled to receive the collector current from the first emitter-coupled transistor and a second replicator transistor coupled to receive the collector current from the second emitter-coupled transistor. The first replicator transistor and the second replicator transistor have their bases coupled together. To address the problem of saturation of the differential amplifier core first and second emitter-coupled transistors, in a further embodiment of the invention, the differential amplifier further comprises a first level shift device that voltage couples the emitter of the first replicator transistor to the base of the first adaptive current source transistor and a second level shift device that voltage couples the emitter of the second replicator transistor to the base of the second adaptive current source transistor. The first and second level shift devices also serve to prevent saturation of the adaptive current source first and second transistors.

DETAILED DESCRIPTION OF THE INVENTION

Figure 1:
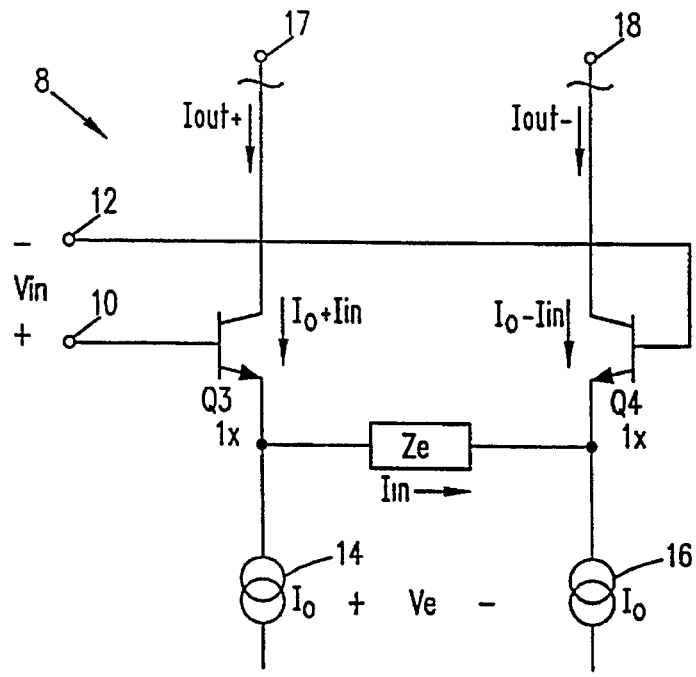
FIG. 1 is a schematic diagram illustrating a conventional differential amplifier.
Figure 2:
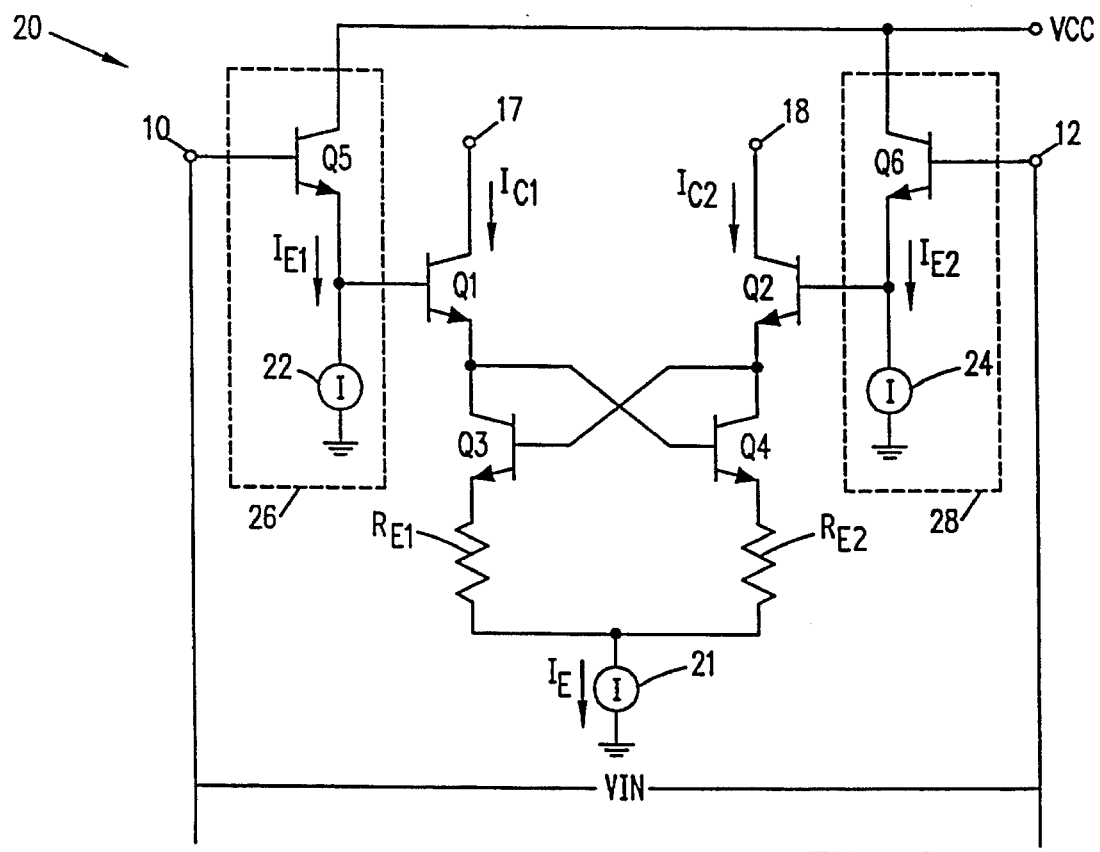
FIG. 2 is a schematic diagram illustrating a prior art differential amplifier which addresses the problem of gain distortion.
Figure 3:
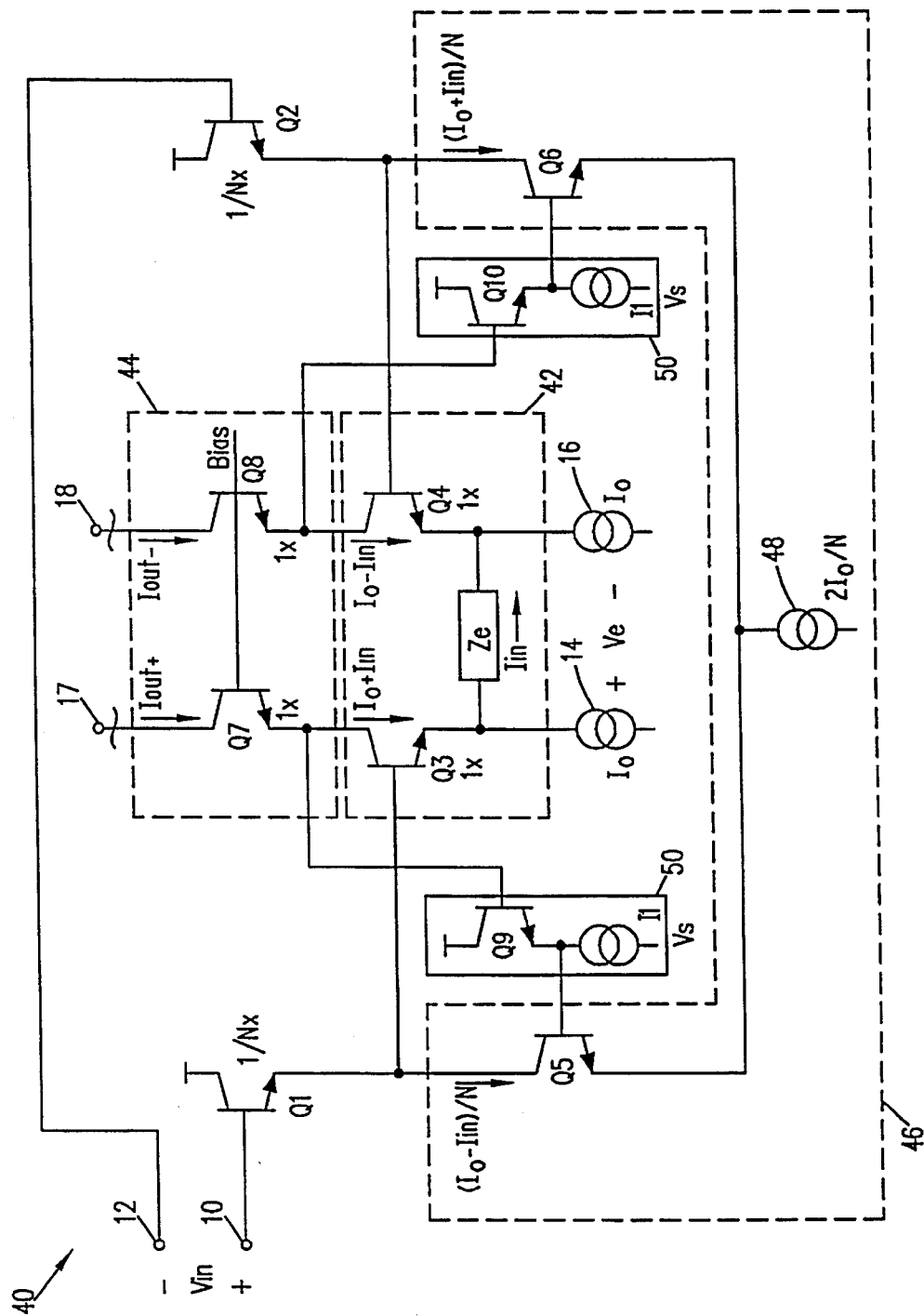
FIG. 3 is a schematic diagram illustrating a differential amplifier in accordance with the present invention.

FIG. 3 shows a differential amplifier 40 in accordance with the present invention. The differential amplifier 40 is coupled to receive a first differential input voltage signal Vin at a pair of amplifier input terminals 10, 12. The differential amplifier 40 outputs a differential output current signal, which is substantially proportional to the differential input voltage signal Vin, at a pair of amplifier output terminals 17, 18.

A differential amplifier core 42 includes first and second emitter-coupled transistors Q3, Q4 connected to receive at their bases an amplifier core differential voltage signal. A load element ZE couples the emitters of the first and second emitter coupled transistors Q3, Q4. Load element ZE may be, for example, a degenerative, resistive load. In other embodiments, the load element ZE may be, for example, a capacitor or a diode. If the load element ZE is a capacitor, the differential amplifier 40 functions as a differentiator; if the load element ZE is a diode, the differential amplifier exhibits an exponential gain characteristic. The emitters of the first and second emitter-coupled transistors Q3, Q4 are coupled to receive first and second constant currents, respectively, from first and second constant current sources 14, 16, respectively. In any configuration, the differential amplifier exhibits a predetermined gain characteristic.

First and second emitter follower transistors Q1, Q2 have their bases respectively coupled to receive the first differential input voltage signal from the pair of amplifier input terminals 10, 12. The first and second emitter follower transistors Q1, Q2 have their emitters coupled to provide the amplifier core differential voltage signal to the bases of the first and second emitter-coupled transistors Q3, Q4, respectively.

A VBE difference replicator 44 is coupled to receive the current in the collectors of the first and second emitter-coupled transistors Q3, Q4, and to provide, responsive to the emitter-coupled transistors' collector currents, a replicated voltage that substantially replicates a voltage difference between the VBE of the first emitter-coupled transistor Q3 and the VBE of the second emitter-coupled transistor Q4. For example, as shown in FIG. 3, the VBE difference replicator 44 may comprise a first replicator transistor Q7 coupled to receive the collector current from the first emitter-coupled transistor Q3, and a second replicator transistor Q8 coupled to receive the collector current from the second emitter-coupled transistor Q4, the base of the first replicator transistor Q7 being coupled to the base of the second replicator transistor Q8.

An adaptive current source 46 is coupled to receive current from the emitters of the first and second emitter follower transistors Q1, Q2, respectively, and is further coupled to receive the replicated voltage from the VBE difference replicator 44. The adaptive current source 46 draws a differential correcting current signal through the first and second emitter follower transistors Q1, Q2, responsive to the replicated voltage.

The operation of the differential amplifier 40 is now discussed. In the following discussion, it is assumed that all of the transistors of the differential amplifier 40 have infinite current gain when not saturated. In addition, it is assumed that the base currents of the transistors are negligible and that, thus, the collector currents are identical to the emitter currents.

When the differential input voltage signal Vin is applied at the amplifier input terminals 10, 12, a voltage VE is developed across the load element ZE. Meanwhile, a current Iin is developed across the load element ZE. A current IL+=$I_0$+Iin (where $I_0$ is the constant current received at the emitter of the first and second emitter-coupled transistors Q3, Q4) flows through the first replicator transistor Q7. A current IL−=$I_0$−Iin flows through the second replicator transistor Q8.

It can thus be seen that, since the current IL+ flowing through the first emitter-coupled transistor Q3 differs from the current IL− flowing through the second emitter-coupled transistor Q4, the VBE of the first emitter-coupled transistor Q3 (VEBQ3) differs from the VBE of the second emitter-coupled transistor Q4 (VBEQ4). As discussed above in the Background, this VBE difference varies with temperature and also with Iin, the difference being greatest when Iin becomes close to $I_0$. In accordance with the present invention, the first and second emitter follower transistors Q1 and Q2 are biased with currents from the adaptive current source 46. The first and second emitter followers Q1, Q2 compensate the first and second emitter-coupled transistors Q3, Q4 for the VBE difference of the first and second emitter-coupled transistors Q3, Q4.

In particular, the current densities in the first and second emitter follower transistors Q1 and Q2 are identical to the current densities in the second and first emitter-coupled transistors Q4, Q3, respectively. Thus, the difference between VBEQ4 and VEBQ3is compensated exactly at the bases of first and second emitter-coupled transistor Q3, Q4 by the difference between VBEQ1 and VBEQ2, where the difference between VBEQ1 and VBEQ2 is a result of the difference between VBEQ7 and VBEQ8.

This results in the voltage VE across the load element ZE being exactly equal to Vin, the differential input voltage signal at the pair of amplifier input terminals 10, 12. The operation of the differential amplifier 40 can be seen from the following equations:

$$VBEQ7-VBEQ8=VEBQ3-VBEQ4.$$

(VEQx represents the voltage at the emitter of transistor Qx.)

This voltage difference is forced across the bases of the first and second adaptive current source transistors Q5 and Q6 (level shifted by first and second level shift transistors Q9, Q10), each biased by a constant current I1. First and second adaptive current source transistors Q5, Q6 have their collectors coupled to the emitters of first and second emitter follower transistors Q1, Q2.

First and second adaptive current source transistors Q5, Q6 are each emitter-biased by a constant current $I_0/N$ from, e.g., a single constant current source 48 connected to the emitters of first and second adaptive current source transistors Q5, Q6 and providing a constant current $2I_0/N$. $I_0$ is the same as the bias current provided to the emitters of first and second emitter-coupled transistors Q3, Q4; N is a scaling factor. The value of N is chosen to minimize the power dissipated by first and second adaptive current source transistor Q5, Q6.

Since the current transistor is an exponential function of its base emitter voltage, VBE, it follows that the ratio of the currents in two transistors is an exponential function of the VBE difference between them. Thus, since (VBEq6−VBEq5)=(VBEq7−VBE8)=(VBEq3−VBEq4), $$\frac{Iq6}{Iq5} = \frac{Iq7}{Iq8} = \frac{Iq3}{Iq4} = \frac{Io+Iin}{Io-Iin}$$

Also, $$Iq5 + Iq6 = \frac{2Io}{N}$$

Combining the last two equations, yields $$Iq5 + Iq5 \times \frac{Io+Iin}{Io-Iin} = \frac{2Io}{N}$$

Solving for Iq5, yields $$Iq5 = Iq1 = \frac{2Io}{N} \times \left( \frac{Io-Iin}{2Io} \right) = \frac{Io-Iin}{N} = \frac{Iq4}{N}$$

Similarly, $$Iq6 = Iq2 = \frac{2Io}{N} \times \left( \frac{Io+Iin}{2Io} \right) = \frac{Io+Iin}{N} = \frac{Iq3}{N}$$

Since first and second emitter follower transistors Q1, Q2 are also scaled down by 1/N, their current densities, and thus their VBE's, are equal to those of Q4 and Q3, respectively. Therefore, $$VE=Vin-(VBEq1+VBEq3)+(VBEq2+VBEq4)=Vin$$

regardless of the values of each individual VBE. This results in output currents, ($I_0$±Iin), that vary linearly with Vin and have low distortion.

The value of the voltage bias, BIAS, for biasing the bases of the first and second replicator transistor, Q7 and Q8, is such that first and second emitter-coupled transistors Q3, Q4 do not saturate over a wide range of common-mode Vin's. Considering the base-collector voltage of first emitter-coupled transistor Q3, the minimum value for BIAS to keep the first emitter-coupled transistor Q3 from saturating is $$BIAS \geq \left( Vcm + \frac{Vdm}{2} - VBEq1 \right) + (VBEq7) - Vmargin.$$

Vcm and Vdm are the common mode and differential mode voltages on the single-ended input terminal 10 and 12. (Vcm and Vdm/2) is the highest expected voltage on the input terminal 10 and 12. VBEQ1 and VBEQ7 are usually within 100 mV of each other, and Vmargin is a marginal forward bias on Q3 collector junction without severe distortion effect, usually ~0.3 V. For any given Vcm and Vdm requirements, BIAS can be chosen according to the above expression.

For large Vin inputs, first and second adaptive current source transistors Q5, Q6 may saturate. A level shift circuit 50, provided between the VBE replicator 44 and the adaptive current source 46 serves to avert this saturation. A voltage level shift Vs can be determined by considering, for example, the base-collector voltage of first adaptive current source transistor Q5. The minimum desired Vs is $$Vs \geq (BIAS - VBEq7) - \left( \left( Vcm - \frac{Vdm}{2} \right) - VBEq1 \right) - Vmargin$$

The term (BIAS−VBEq7) is the voltage at the base of first adaptive current source transistor Q5 without a level shift device; [(Vcm−Vdm/2)-VBEq11] is the lowest expected voltage on the collector of first adaptive current source transistor Q5; and Vmargin is the allowable slight forward bias of a PN junction.

It is noted that level shift circuit 50 is not placed in series with first and second emitter-following transistors Q1, Q2 and first and second emitter-coupled transistors Q3, Q4, respectively Thus, the most negative voltage of the circuit 40, occurring at the emitters first and second emitter-coupled transistors Q3, Q4 is 2 VBE's below the input. This assumes that the most negative voltage at the emitters of first and second adaptive current source transistors Q5 and Q6 is (VBE+VCE) below the input, where VCE is the collector to emitter voltage of Q5 and Q6 (~0.4 V). The voltages at the emitters of first and second emitter-coupled transistors Q3, Q4 are lower than this voltage.

It should be understood that various alternatives to the embodiments of the invention described herein may be employed in practicing the invention. For example, those skilled in the art will appreciate that MOS transistors may be substituted for some or all of the bipolar transistors shown in FIG. 3. It is intended that the following claims define the scope of the invention and that methods and apparatus within the scope of these claims and their equivalents be covered thereby.

What is claimed is:

1. A differential amplifier coupled to receive a first differential input voltage signal at a pair of amplifier input terminals and to output a differential output current signal, which is an exponential function of the differential input voltage signal at a pair of amplifier output terminals, the differential amplifier comprising:

a differential amplifier core including first and second emitter-coupled transistors connected to receive at their bases an amplifier core differential voltage signal, a diode coupling the emitters of the first and second emitter-coupled transistors, the emitters of the first and second emitter-coupled transistors coupled to receive first and second constant currents, respectively;

first and second emitter follower transistors, the bases of which are coupled to receive the first differential input voltage signal from the pair of amplifier input terminals and the emitters of which are coupled to provide the amplifier core differential voltage signal to the bases of the first and second emitter-coupled transistors, respectively;

a VBE difference replicator coupled to receive the current in the collectors of the first and second emitter-coupled transistors for providing, responsive to the emitter-coupled transistors' collector currents, a differential replicated voltage that substantially replicates a voltage difference between the VBE of the first emitter-coupled transistor and the VBE of the second emitter-coupled transistor;

an adaptive current source coupled to receive current from the emitters of the first and second emitter follower transistors, respectively, and coupled to receive the differential replicated voltage from the VBE difference replicator, for drawing a differential correcting current signal through said first and second emitter follower transistors responsive to said differential replicated voltage, whereby a difference between the VBE of the first emitter follower transistor and the VBE of the second emitter follower transistor compensates the amplifier core differential voltage to correct for a difference between the VBE of the first emitter-coupled transistor and the VBE of the second emitter-coupled transistor so that a voltage difference across the diode is substantially equal to the first differential voltage, regardless of VBE variations in the emitter-coupled transistors.

2. A differential amplifier coupled to receive a first differential input voltage signal at a pair of amplifier input terminals and to output a differential output current signal, which is an exponential function of the differential input voltage signal at a pair of amplifier output terminals, the differential amplifier comprising:

a differential amplifier core including first and second amplifier core transistors, each having first and second current handling terminals and a control terminal, the control terminals of the first and second amplifier core transistors being connected to receive an amplifier core differential voltage signal, a diode coupling the first current handling terminal of the first amplifier core transistor to the first current handling terminal of the second amplifier core transistor, the first current handling terminals of the first and second amplifier core transistors being coupled to receive first and second constant currents, respectively;

first and second amplifier input transistors, each having first and second current handling terminals and a control terminal, the control terminals of which are coupled to receive the first differential input voltage signal from the pair of amplifier input terminals and the first current handling terminals of which are coupled to provide the amplifier core differential voltage signal to the control terminals of the first and second amplifier core transistors, respectively;

a voltage difference replicator coupled to receive the currents in the second current handling terminals of the first and second amplifier core transistors for providing, responsive thereto, a differential replicated voltage that substantially replicates a voltage difference between, for the first amplifier core transistor, the voltage difference between the control terminal and the first current handling terminal, and, for the second amplifier core transistor, the voltage difference between the control terminal and the first current handling terminal;

an adaptive current source coupled to receive current from the first current handling terminals of the first and second input transistors, respectively, and coupled to receive the differential replicated voltage from the voltage difference replicator, for drawing a differential correcting current signal through said first and second input transistors responsive to said differential replicated voltage.

\* \* \* \* \*